(12) United States Patent
Pio

(10) Patent No.: US 8,248,851 B1
(45) Date of Patent: Aug. 21, 2012

(54) SYSTEM, APPARATUS, AND READING METHOD FOR NAND MEMORIES

(75) Inventor: Federico Pio, Brugherio (IT)

(73) Assignee: Micron Technology, Inc., Boise, ID (US)

( * ) Notice: Subject to any disclaimer, the term of this patent is extended or adjusted under 35 U.S.C. 154(b) by 334 days.

(21) Appl. No.: 12/628,073

(22) Filed: Nov. 30, 2009

(51) Int. Cl.
*G11C 16/04* (2006.01)

(52) U.S. Cl. ......... 365/185.11; 365/185.21; 365/185.17; 365/185.12; 365/189.04

(58) Field of Classification Search .............. 365/185.11, 365/185.21, 185.17, 185.12, 185.13, 189.04
See application file for complete search history.

(56) References Cited

U.S. PATENT DOCUMENTS

2010/0008165 A1 * 1/2010 Macerola et al. ........ 365/189.15
* cited by examiner

*Primary Examiner* — Thong Q Le
(74) *Attorney, Agent, or Firm* — Schwegman, Lundberg & Woessner, P.A.

(57) ABSTRACT

A system, apparatus, and method to read a memory cell of a memory device is described. The method includes biasing a drain select line (DSL), a source select line (SSL), and unaddressed wordlines of a memory block to a pass voltage to set the DSL, SSL, and unselected word lines into a conducting status; applying a source reading voltage to a source node of the source line; biasing a wordline coupled to the memory cell to a reading voltage; and evaluating the voltage of the bit line. The logical status of the addressed memory cell is based on sensing the bit line voltage during a charging phase of the bit line.

18 Claims, 11 Drawing Sheets

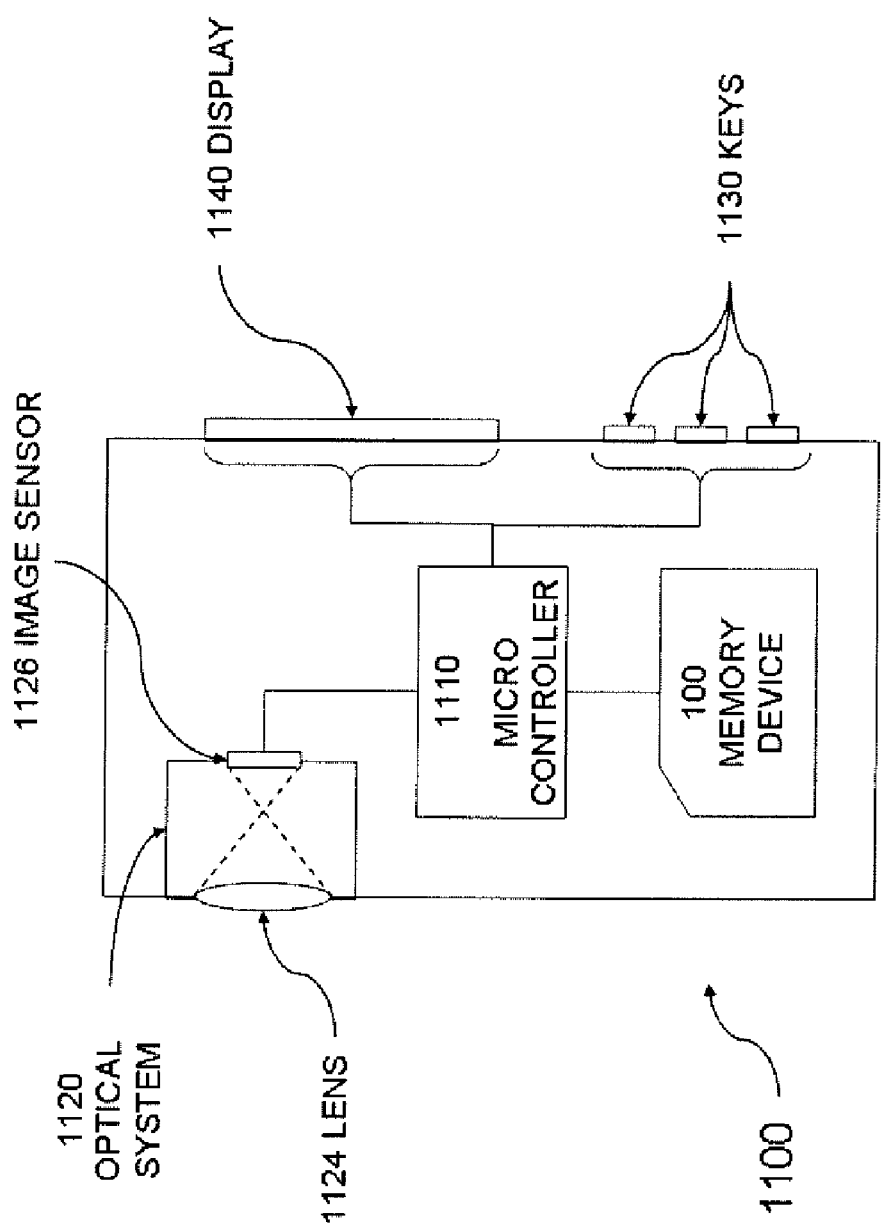

SYSTEM, APPARATUS, AND READING METHOD FOR NAND MEMORIES

TECHNICAL FIELD

Embodiments of the present invention relate to a method for reading a memory, and especially a non-volatile memory with NAND architecture. These embodiments also relate to a memory device and especially to a non-volatile NAND memory device.

BACKGROUND OF THE INVENTION

The use of non-volatile memories, i.e. those memories that retain stored information even when power is turned off, has noticeably increased. Many applications need to store large quantities of information for later use and to access the non-volatile device with high speed, both when writing the data into the device and when retrieving it. For example, digital cameras and camcorders are using higher and higher resolution, leading to a dramatic increase of the memory size needed for storing each picture or frame.

NAND memory devices are often the preferred solution because of the high density that can be achieved. However, it's becoming difficult for present day non-volatile memory devices to meet the speed requirements while maintaining high reliability, especially when multi-bit per cell storage is implemented to further increase the memory capacity. Despite the major advances in technology, process control is not perfect and unavoidable fluctuations are present not only from one device to another, but also on the same die. These fluctuations reduce the design margins and unfavorably impact the working window of the device, to the limit that reading of the stored data is not sufficiently reliable and other countermeasures need to be set in place, such as complicated error correction codes.

Reading speed is a most critical parameter in non-volatile memory performances. Reading of the memory also occurs during the erasing and the programming operations to verify the charge status of the memory cells and determine the progress status of the erase/write operation. Accordingly, the reading speed also impacts the programming and the erasing speed.

The problems above are even more critical in multi-level cells (MLC), because it is necessary to set the charge status of each memory cell very precisely and correspondingly a considerable increase of the number of precise verification accesses to the memory is observed to precisely determine the cell's threshold voltage. This impacts the execution time, especially in random accesses to the memory, when a fast reply would be desirable. Moreover, in many cases a considerable consumption is unavoidable, which makes the use of these memories less appealing in portable and battery-supplied equipment.

BRIEF DESCRIPTION OF THE DRAWINGS

The features and advantages of the present invention will be made apparent by the following detailed description of some embodiments thereof, illustrated merely by way of non-limiting examples in the annexed drawings, wherein:

FIG. 11 illustrates a block diagram of a system that incorporates a memory device according to an embodiment of the invention.

DETAILED DESCRIPTION OF THE INVENTION

In the following detailed description, numerous specific details are set forth in order to provide a thorough understanding of the invention. However, it will be understood by those skilled in the art that embodiments of the present invention may be practiced without these specific details. In other instances, well-known methods, procedures, components and circuits have not been described in detail so as not to obscure the present invention.

It is also clarified that the terms "to read", "reading", and "accessing the memory" to retrieve or sense data are intended in a broad sense, i.e. not merely to obtain a logical value of the stored datum for outputting it to the user, but also to obtain information on the status of the memory cell not directly useful for user purposes, for example during a verification step in an erase operation or in a program operation. So, despite the description and claims may use such a wording, it is understood that also the verification or other operations implying the determination of the memory state is comprised in the spirit and scope of the invention.

Figure 1:
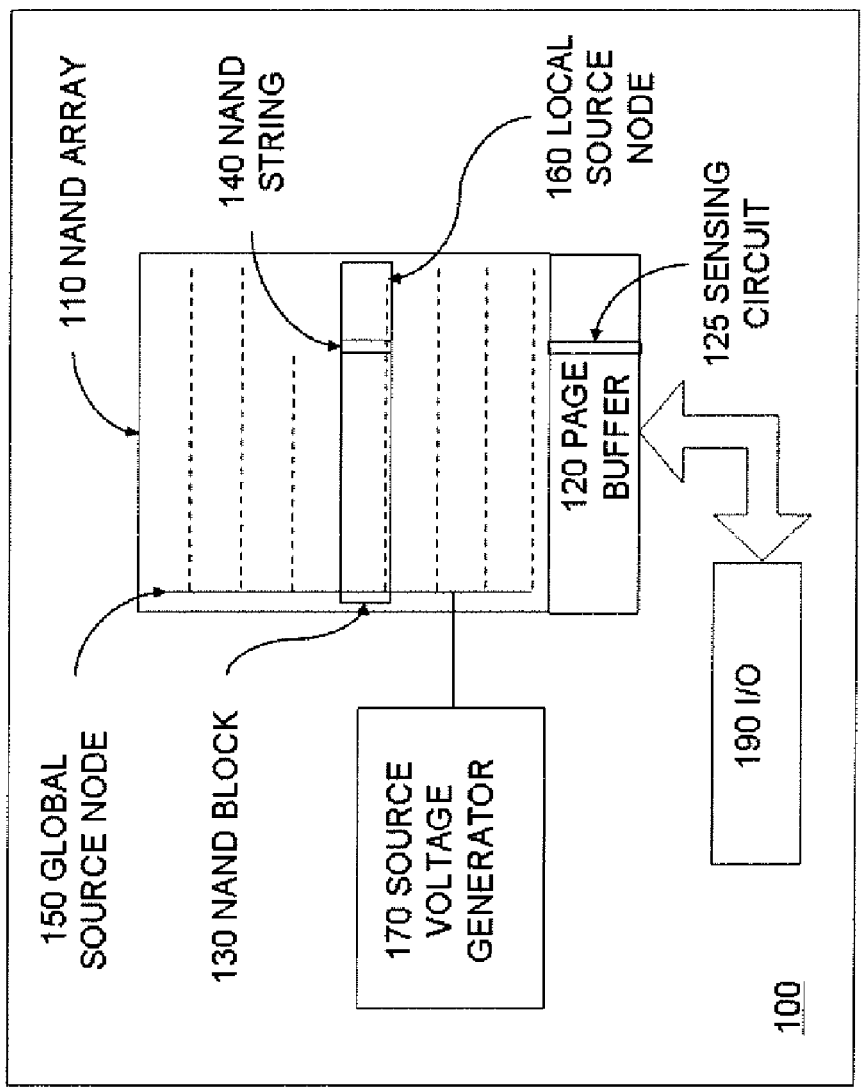
FIG. 1 illustrates a block diagram of a memory device according to one embodiment of the invention.

FIG. 1 illustrates a block diagram of a memory device 100 according to one embodiment of the invention. The device 100 includes an array 110 of NAND memory cells for storing non-volatile information. The NAND array 110 is coupled to a page buffer 120 for writing data into, and for retrieving data from, the memory cells in the NAND array 110. Page buffer 120 is coupled to Input/Output circuitry 190 for receiving data, addresses and control signals from external devices coupled to the memory device 100 and sending data and control signals to the external devices.

The NAND array 110 is divided in a plurality of NAND blocks 130 comprising a plurality of NAND strings 140 and each string comprises a plurality of memory cells on respective bit and word lines, as described below in greater detail.

The NAND strings 140 are coupled through respective bit lines to corresponding sensing circuits 125 in the page buffer 120. In one embodiment, more than a single NAND string 140 is coupled to the same sensing circuit 125, for example two NAND strings are selectively coupled through a switching element to a single sensing circuit 125 (with reference to FIG. 2 odd string 211 and even string 212). The sensing circuit 125 is used to program and erase the memory cells in the NAND string(s) it is coupled to.

The NAND array 110 also has a global source node 150 coupled to a source voltage generator 170 for supplying a voltage to the global source node 150 during a read operation of an addressed memory cell of an addressed NAND block 130 in the NAND array 110 of device 100.

The addressed NAND block 130 has a local source node 160 coupled to the NAND strings 140 of the NAND block 130. In one embodiment the local source node 160 is connected to the global source node 150. In another embodiment, the local source node 160 is coupled to the global source node 150 through selection devices (not shown in FIG. 1) that allow for selective transferring of the voltage supplied by the source voltage generator 170 to the selected local source node 160 during a read operation while keeping the local source node of unselected NAND blocks unbiased. In a further embodiment, the source voltage generator 170 supplies a source voltage for the read operation that is transferred to the local source node 160 of the selected NAND block 130 through a decoding circuit (not shown in FIG. 1) outside of the NAND array 110 (i.e. the global source node 150 is not located inside the NAND array 110).

Figure 2:
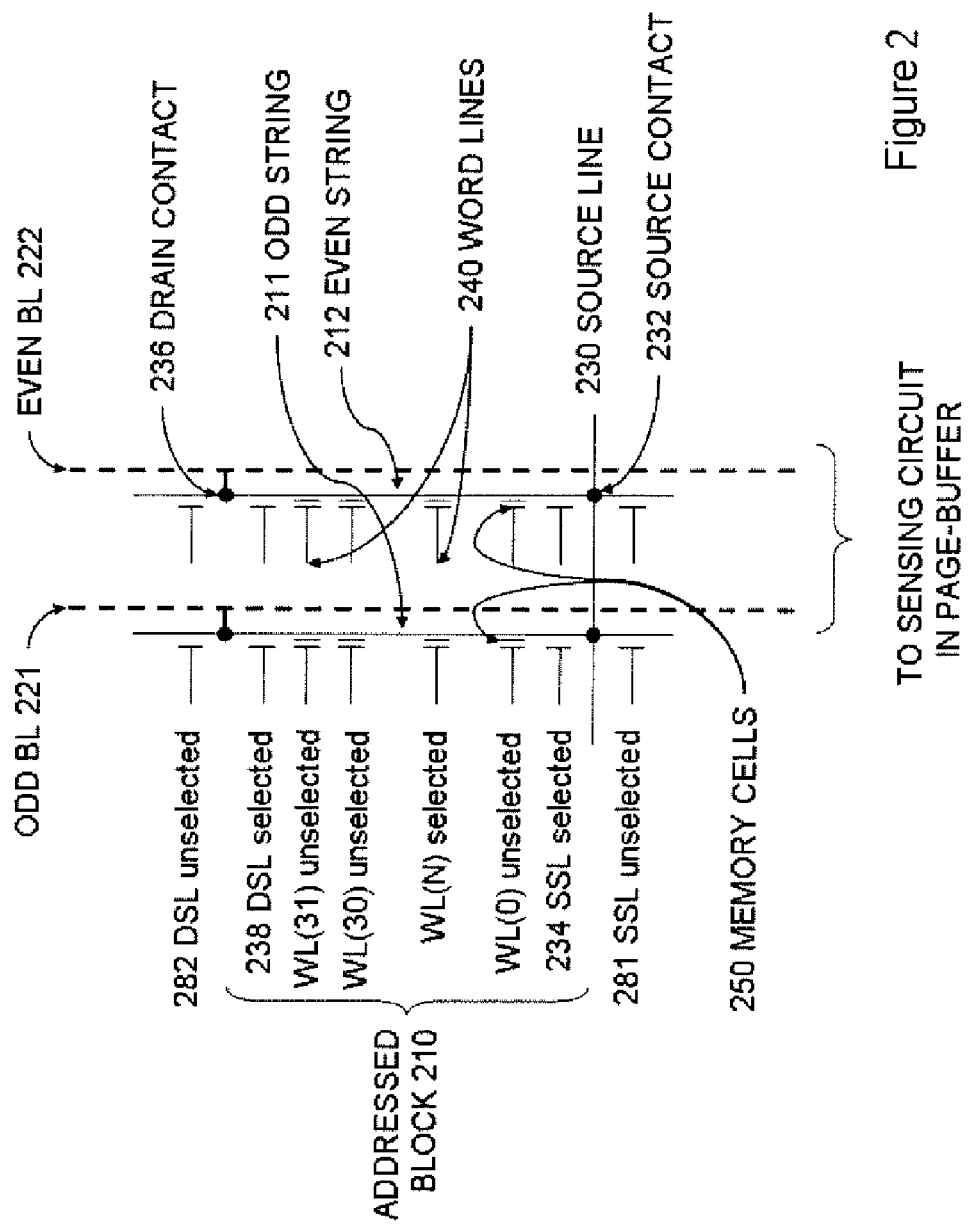
FIG. 2 illustrates a schematic representation of an embodiment of a portion of a memory array.

FIG. 2 schematically illustrates a portion of a NAND array 110. Only a pair of NAND strings (odd string 211 and even string 212—each one of which corresponds to one of the NAND strings 140 of FIG. 1) in an addressed block 210 are shown. The addressed block 210 corresponds to one of the NAND blocks 130 in NAND array 110 of FIG. 1. Each string is coupled to respective bit line (odd string 211 to odd bit line 221, and even string 212 to even bit line 222) through a drain contact 236.

Each bit line (221, 222) is also coupled to a page-buffer (120 in FIG. 1) to store data into, and read data, from, the addressed memory cells. In one embodiment, the pair of bit lines (odd 221 and even 222) is coupled to the same sensing circuit 125 in the page-buffer 120. In another embodiment (not shown) more than two bit lines share the same circuit 125 in the page buffer 120.

Each string is coupled to a source line 230 through a source contact 232. In one embodiment, the source line 230 is the global source line 150 common to the whole NAND array 110. In another embodiment, the source line 230 is the local source node 160 of the addressed block appropriately decoded as explained above.

A plurality of memory cells 250 are serially coupled to each other in the NAND strings (211, 212) between the drain contact 236 and a source contact 232. A drain select line (DSL) 238 is interposed between the memory cells 250 and the drain contact 236 of each string 140 in all NAND blocks 130 to allow selection of an addressed block 210 (the same bit line is coupled to one string in several NAND blocks 140); similarly a source select line (SSL) 234 is interposed between the memory cells 250 and the source contact 232. The DSL and the SSL form a pass transistor serially coupled to the NAND memory cells 250.

Each memory cell 250 is also coupled to a respective word line 240. A plurality of word lines (WL), typically in power of 2, runs in a direction substantially perpendicular to the bit lines. Each WL is also coupled to other memory cells 250 in the same NAND block but in different NAND strings (i.e. in odd string 211 and in even string 212). For addressing purposes the word lines are labeled and decoded as WL(0), WL(1), . . . , and WL(31). During a read operation, only one word line is selected, or addressed, at a given moment in time, i.e. WL(N) in the representation of FIG. 2. The remaining unselected (unaddressed) word lines of addressed block 210 are biased to a pass voltage to allow continuity of the conductive path between drain and source, that is between the bit line (221, 222) and the source line 230. Unaddressed blocks (and corresponding word lines) are deselected by appropriate polarization of their unselected DSL 282 and unselected SSL 281. In one embodiment one or more additional dummy word lines (not shown in FIG. 2) are present in each string adjacent to the SSL 234 and/or the DSL 238.

To optimize area occupation the structure described above is symmetrically repeated for adjacent NAND blocks 130 sharing the drain contact 236 or the source contact 232 and the source line 230 at the opposite side of each NAND block 130. In FIG. 2 are also illustrated the source select line (SSL) 281 for the (unaddressed) block sharing the source line 230 and the source contact 232 with the addressed block 210 and the drain select line (DSL) 282 for the (unaddressed) block sharing the drain contact 236 with the addressed block 210.

In the following several embodiments of the invention will be described. A common feature of the different embodiments is that reading is carried out during a charging phase of the bit lines, rather than during a discharging phase. A source reading voltage is applied to the source line to charge the addressed bit line responsive to the conductive state of the addressed memory cell. If the addressed memory cell is in a conductive state the corresponding bit line charges while if, on the contrary, the addressed memory cell is in a non-conductive state the bit line remains uncharged. A difference in the charge state of the bit line, i.e. in its voltage, is detected and a corresponding logical state of the memory cell is sensed.

Such an operating mode has several advantages, as will be clear from the discussion below. In particular it is less sensitive to process variations that otherwise may impact the reading performances. For example, the differences among bit lines conductivity and/or the leakage of the reverse biased junction coupled to the bit line are essentially unimportant because the source node is biased and maintained to a source reading voltage so that it acts as a power source supplying the charging voltage to all bit lines, irrespective of the current drained. This is a great advantage with respect to conventional bit line discharge sensing techniques, that are very sensitive to such fluctuations, and allows a much greater reading precision and larger working windows. Other advantages, for example regarding a diminished consumption and a shorter reading time, will become clear with the discussion that follows.

Figure 3:
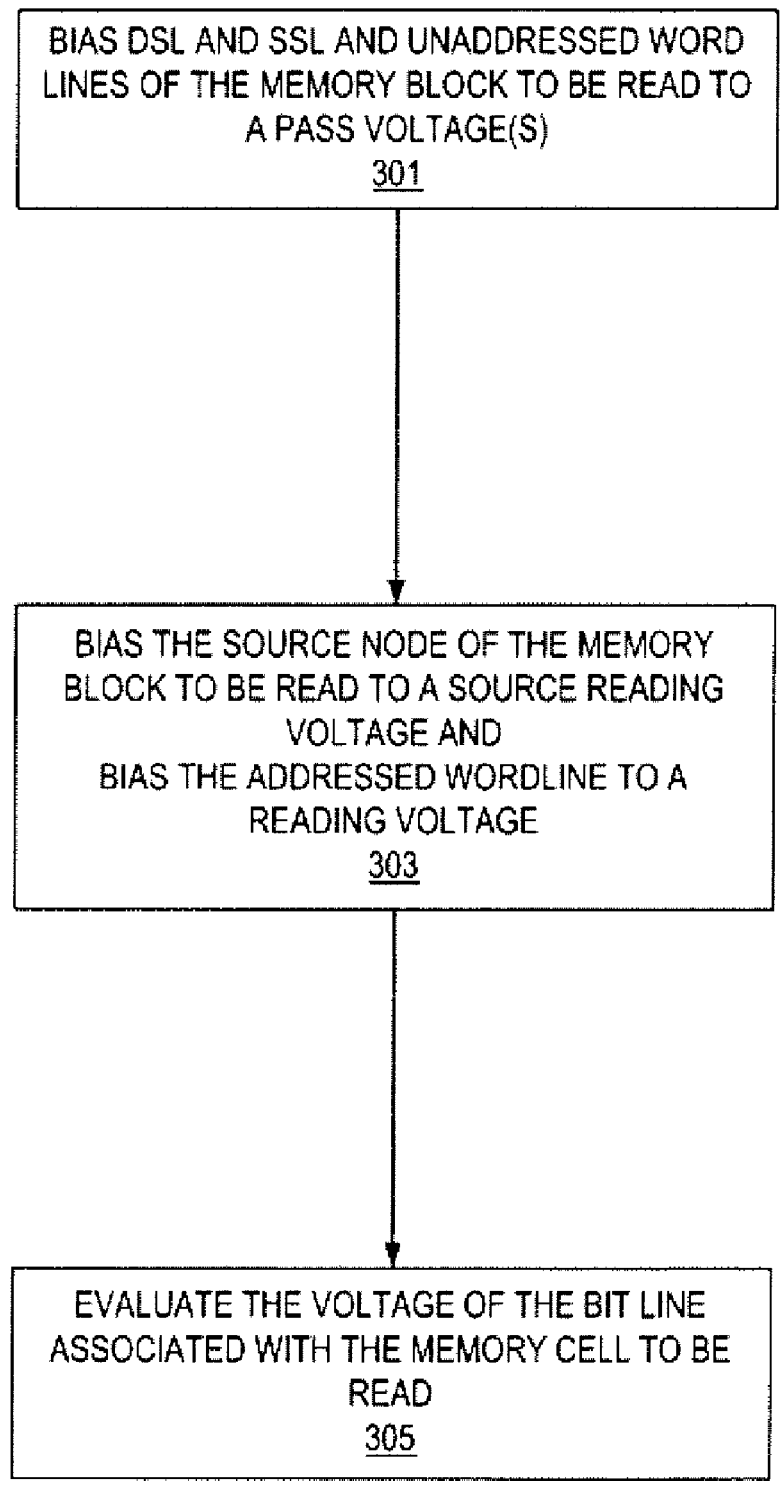
FIG. 3 illustrates an embodiment of a reading method for reading a memory cell value of an addressed memory block.

FIG. 3 depicts an embodiment of a method of reading a memory cell value of an addressed memory block. Typically, reading a memory cell value is initiated via a read command which is received by the memory device. This command identifies which cell, or cells, are to be read from the memory block.

The DSL, SSL, and unaddressed word lines of the memory block to be read are biased to a pass voltage at 301. For example, the DSL 238 of FIG. 2 would be biased to the pass voltage value of $V_{DSL\ selected}$ and the SSL 234 would be biased to pass voltage value of $V_{SSL\ selected}$. Additionally, the unaddressed or unselected word lines (WL(i≠N)) of the addressed memory block are biased to pass voltage value of $V_{WL\ unselected}$.

The source line of the memory block to be read is biased to a source reading voltage and the addressed word line is biased to a reading voltage at 303. For example, the source line 230 would be biased to the source reading voltage and the addressed or selected word line would be biased to the lowest reading voltage ($V_{WL\ selected}$) in the plurality of word line reading voltages (in case of a single level memory cell, as in FIG. 4, such a word line reading voltage is the only reading voltage $V_{WL\ read}$). Of course, the order of biasing may be different than what is illustrated. For example, all of these lines may be biased that the same time, one at a time in any order, etc.

The bit line voltage ($V_{BL}$) is sensed (evaluated) at a predetermined evaluation time at 305. For example, the sensing circuit 125 in the page buffer 120 may perform this sensing by coupling the bit line to a latch that commutes if the bit line voltage is higher than the latch's threshold voltage.

Depending on the operation, further enhancements may be possible such as double/multiple reading speed operation which are described in detail below.

Figure 4:
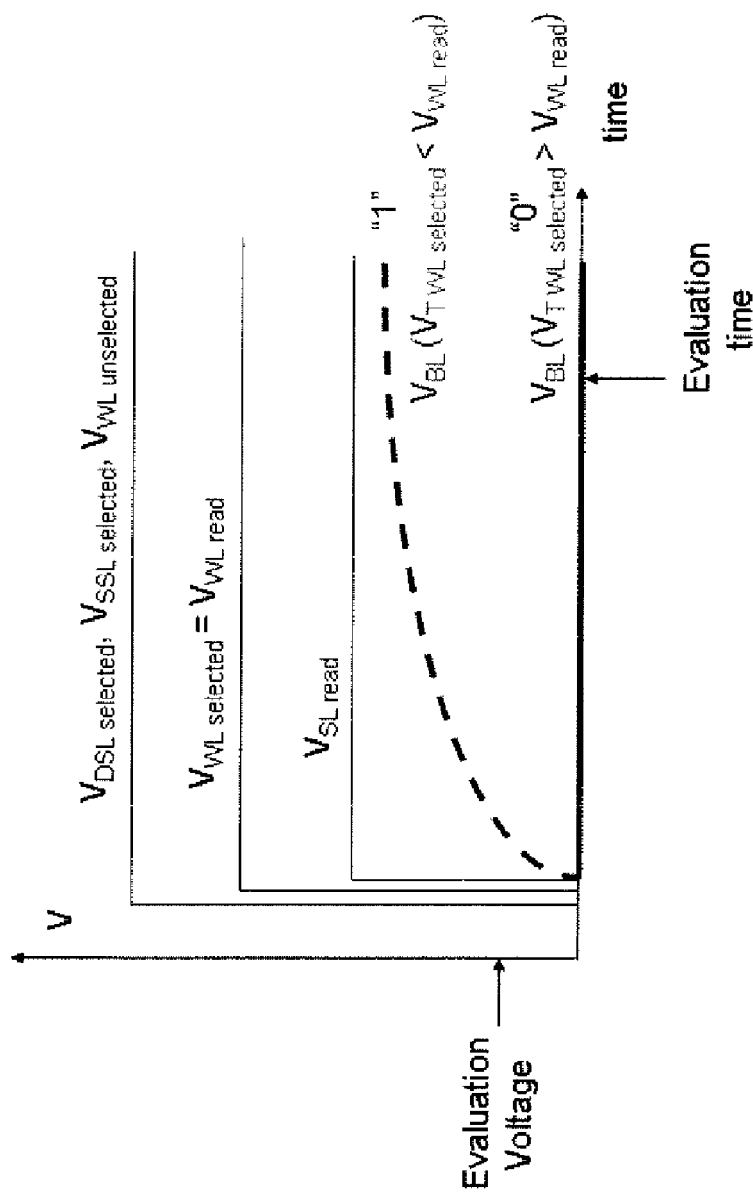
FIG. 4 illustrates the signal evolution with respect to time during a reading operation of a memory cell according to the reading method in FIG. 3.

FIG. 4 schematically illustrates the time evolution of the signals on some selective nodes of an addressed memory block during a reading operation of a memory cell of the addressed block according to one embodiment of the invention. The description herein is in reference to FIG. 2, however, this is merely illustrative.

In the addressed block 210, the drain select line (DSL) 238 and the source select line (SSL) 234 are biased to a respective pass voltage ($V_{DSL\ selected}$, $V_{SSL\ selected}$) to turn the corresponding selection transistors, in series with the addressed memory cell in the string, to an ON conductive state. The $V_{DSL\ selected}$ and $V_{SSL\ selected}$ pass voltages are in the range of 5 to 9V, for example 7V. The DSL and the SSL pass voltages are not necessarily the same voltage. The DSL 282 and SSL 281 of unaddressed blocks are biased to an inhibition voltage, for example to ground, to deselect the unaddressed blocks (not shown in FIG. 3).

The unselected word lines of the addressed block 210 (WL(0), WL(1), ..., WL(N−1), WL(N+1), ..., WL(30), WL(31), i.e. all word lines in the addressed block 210 except the selected word line WL(N)) are biased to a pass voltage ($V_{WL\ unselected}$) to turn ON, i.e. to a conductive state. With these biasing conditions, the threshold voltage ($V_{T\ WL\ unselected}$) of all unselected memory cells is lower than the pass voltage ($V_{WL\ unselected}$), and the corresponding (unselected) memory cells in series with the addressed cell in the addressed string do not open the source line to bit line path, irrespective of the data stored in these unselected memory cells. The pass voltage ($V_{WL\ unselected}$) is in the range 5 to 9V, for example 7V. In one embodiment, it is the same voltage as the $V_{DSL\ selected}$ and/or the $V_{SSL\ selected}$ voltage.

A source reading voltage ($V_{SL\ read}$) is applied to the global 150 or local 160 source node of the addressed memory block to bias the source line 230 coupled to the addressed memory cell to be read. The source reading voltage ($V_{SL\ read}$) is in the range 1-5V, for example 3V.

The selected word line (WL(N)), coupled to the addressed memory cell, is initially grounded. The selected word line (WL(N)) is then biased to a word line reading voltage ($V_{WL\ read}$) the range 0-5V, for example 0V. The selected word line reading voltage is supplied by a word line voltage generator (not shown in FIG. 1). Responsive to the word line reading voltage ($V_{WL\ read}$), the addressed memory cell turns to an ON state or to an OFF state, therefore closing or opening a conductive path between the source line 230 and the addressed bit line. Note that in the embodiment depicted the WL reading voltage ($V_{WL\ read}$) is larger than the source line reading voltage ($V_{SL\ read}$). For example, $V_{WL\ read}$=3V and $V_{SL\ read}$=2V. However, the $V_{WL\ read}$ and $V_{SL\ read}$ voltages may be in a different relationship, depending on the memory cell's threshold voltage to be sensed.

The addressed memory cell is in a conductive state if its threshold voltage ($V_{T\ WL\ selected}$)WL selected) is lower than the word line reading voltage ($V_{T\ WL\ selected}$<$V_{WL\ read}$) and a source to drain conduction path is formed and the bit line (initially in a discharged state) charges. If, on the contrary, the threshold voltage of the addressed memory cell is higher than the word line reading voltage ($V_{T\ WL\ selected}$>$V_{WL\ read}$), the memory cell remains in its OFF state and the source to drain conduction path is interrupted, so that the bit line does not charge and remains discharged.

After a pre-fixed evaluation period (such as at t=evaluation time in FIG. 4) the charge state of the addressed bit line ($V_{BL}$) is sensed, for example, by the sensing circuit 125 in the page-buffer 120, to determine the logical state of the addressed memory cell. For example, the addressed bit line is coupled to a latch (in the sensing circuit 125) in a pre-defined state and the latch switches only if the bit line voltage is higher than an evaluation voltage (i.e. the latch threshold voltage). In one embodiment, the evaluation period and therefore the evaluation time are determined by a timer, not shown in FIG. 1, such as a clock or a delay circuit, for example of the analog type (RC or the like).

With the reading method described above it is therefore possible to discriminate between a conductive and a non-conductive state of the addressed memory cell by sensing the bit line during a charging phase of the reading operation. The source node acts as a power source and the bit line charging is essentially only a function of the threshold voltage ($V_{T\ WL\ selected}$) of the addressed memory cell (with respect to the selected word line's reading voltage). A corresponding binary logical state may be associated to the result of the bit line voltage sensing and cell's state discrimination.

As an example, using a selected word line reading voltage $V_{WL\ read}$=0V and $V_{SL\ read}$=3V (with $V_{DSL\ selected}$=$V_{SSL\ selected}$=$V_{WL\ unselected}$=7.5V) it is possible to discriminate between a selected memory cell with negative threshold voltage (in a conductive state), representing a logical value "1," and one with positive threshold voltage (in a non-conductive state), representing a logical value "0". Looking at FIG. 4, the logical value "1" is illustrated where $V_{BL}$ ($V_{TWLselected}$<$V_{WLread}$) as a dashed line.

The above description may also be utilized for a reading method for multi-level cells or cells storing more than a single bit of information. In this case the threshold voltage ($V_{T\ WL\ selected}$) of the memory cells may be in one of a plurality of non-overlapping allowed voltage ranges.

Figure 5:
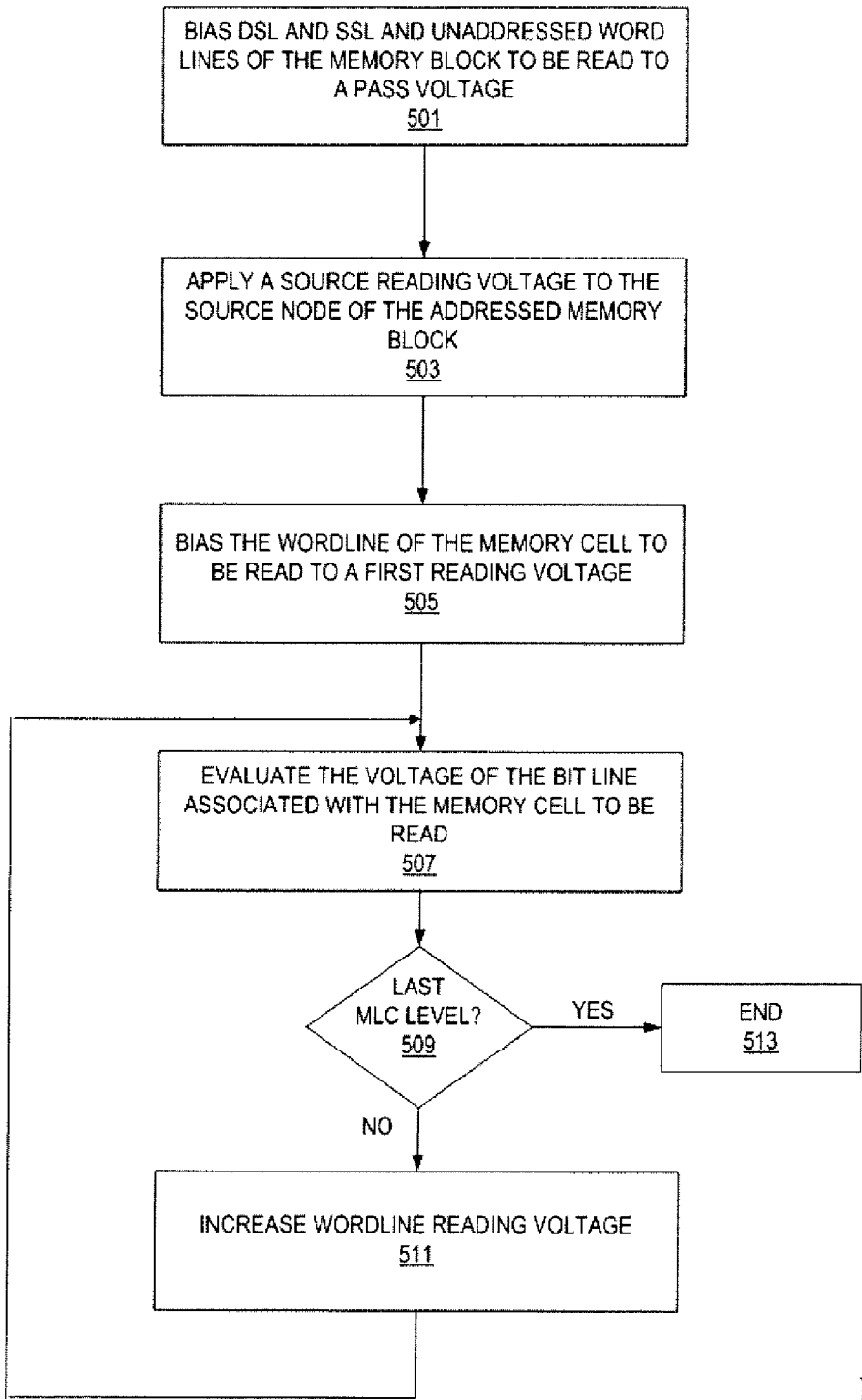
FIG. 5 illustrates an embodiment of a reading method for reading multi-level memory cell values of an addressed memory block

FIG. 5 depicts an embodiment of a method of reading multi-level memory cell values of an addressed memory block.

As in the previous method of FIG. 3, all unaddressed memory cells in the string are set to a conductive state by biasing the unselected word lines (WL(i≠N)) in the addressed block to a pass voltage $V_{WL\ unselected}$ at 501. Also the drain select line (DSL) 238 and the source select line (SSL) 234 are biased to a respective pass voltages ($V_{DSL\ selected}$) and ($V_{SSL\ selected}$) at 501. A source reading voltage ($V_{SL\ read}$) is applied to the global 150 or local 160 source node to bias the source line 230 coupled to the addressed memory cell to be read at 503.

A stepwise sensing approach is then utilized. In this approach, the word line reading voltage is stepwise biased to a plurality of word line reading voltages (such as $V_{WL\ read1}$, $V_{WL\ read2}$, and $V_{WL\ read3}$ with reference to FIG. 6). In this embodiment, a word line voltage generator (not shown in FIG. 1) generates each of the plurality of word line reading voltages ($V_{WL\ read1}$, $V_{WL\ read2}$, and $V_{WL\ read3}$) responsive to control signals timed with the different steps. During each step, all other voltages are kept substantially constant and the bit line voltage ($V_{BL}$) is left free to evolve.

The voltage of the selected word line WL(N) ($V_{WL\ selected}$) is then biased to a first word line reading voltage ($V_{WL\ read1}$) at 505. This is the first step in a stepwise biasing pattern. After a pre-determined evaluation period, the addressed bit line voltage ($V_{BL}$) is sensed at 507. For example, the addressed bit line is sensed (evaluated) by the sensing circuit 125 in the page buffer 120 so that the state of the memory cell is determined (with respect to the present value of the word line reading voltage, i.e. $V_{WL\ selected}=V_{WL\ read1}$). Memory cells that are in a conductive state are assigned a logical state corresponding to the reading voltage range. For example, a logical value "11" is assigned to memory cells with a negative threshold voltage (corresponding to $V_{WL\ read\ 1}=0V$).

A determination of if the sensed level was the last MLC level is made at 509. If the sensed level was the last MLC level, the reading operation reaches an end at 513. If the sensed level was not the last MLC level, the word line reading voltage is then increased to the next value (i.e., $V_{WL\ selected}=V_{WL\ read2}$) at 511 and after another evaluation period the bit line voltage ($V_{BL}$) is sensed again at 507 to identify those memory cells that have a threshold voltage between the two reading voltages: $V_{WL\ read1} < V_{T\ WL\ selected} < V_{WL\ read2}$ (the bit lines already charged remain in their charged state and may be ignored). A corresponding logical value, i.e. "10," is assigned to memory cells in this range.

The step-like staircase is continued to the maximum value ($V_{WL\ read3}$ in the example of FIG. 6) by applying a different voltage to each level of the MLC and the sensing is repeated at each step, assigning for each memory cell undergoing a transition to a conductive state the corresponding logical value, i.e. "01" at evaluation time (3). The memory cells coupled to the bit lines that remain uncharged when sensed at the maximum word line reading voltage, i.e. $V_{WL\ read3}$, have a higher threshold voltage ($V_{WL\ read3} < V_{T\ WL\ selected}$) and are assigned the remaining logical value (i.e. "00" in the convention adopted in the example above).

It is noted that M-1 word line reading voltage values are sufficient to discriminate among M allowed threshold voltage ranges. For example, $V_{WL\ read1}=0V$, $V_{WL\ read2}=2.5V$, and $V_{WL\ read3}=5V$ are suitable to read a threshold voltage in allowed ranges of $V_T<0V$, $0.5V<V_T<2.0V$, $3.0V<V_T<4.5V$ and $5.5V<V_T$, each having a margin of 0.5V with respect to the reading voltage. In one embodiment, M is not a power of 2 ($M \neq n^2$), so that a logical state may not univocally correspond to a physical state of a single memory cell. For example two or more cells are read and the assignment of the logical state of the symbol (i.e. the plurality of bits) is made according to a combination of their physical states.

If the addressed memory cell has a threshold voltage lower than the word line reading voltage (for the three steps depicted, respectively $V_{T\ WL\ selected} < V_{WL\ read1}$, $V_{T\ WL\ selected} < V_{WL\ read2}$, and $V_{T\ WL\ selected} < V_{WL\ read3}$) a conduction path between source line 230 and the addressed bit line is formed and the latter charges. On the contrary, if the selected memory cell has a threshold voltage higher than the word line reading voltage (i.e., $V_{T\ WL\ selected} > V_{WL\ read1}$, $V_{T\ WL\ selected} > V_{WL\ read2}$, and $V_{T\ WL\ selected} > V_{WL\ read3}$) a conduction path between source line 230 and the addressed bit line is not formed and the latter remains uncharged.

Embodiments of reading method for multi-level memory cells described above have several great advantages with respect to other techniques, also involving a plurality of sensing values splitting the entire range in allowed sub-ranges. Namely the selected word line reading voltage is step-wise increased while maintaining the remaining nodes at their respective biasing voltage. This approach reduces the reading time and consumption because it is not necessary to continuously charge and discharge the different nodes, especially the bit lines. For the same reason it is not necessary to wait for a pre-charging operation to be completed before each sensing step, therefore reducing the overall reading time.

Charging/discharging is unavoidable with the conventional approach featuring bit line pre-charge and bit line voltage evaluation during a discharge phase of the bit lines. In the conventional approach, bit lines discharge more or less quickly depending on the conductive state of the addressed memory cell. If the cell's threshold is lower than word line reading voltage, the bit line discharges relatively quickly through the string, otherwise it will discharge relatively slowly (not through the addressed cell, but through the reverse biased junctions of drain contacts coupled to the addressed bit line, including those of unselected blocks). In any case, it is necessary to repeat the bit line pre-charge operation at each step, that is for each of the M-1 word line reading voltages. With the described embodiments this is not necessary and both the time necessary to complete the pre-charge operation and the energy associated with it are saved. Clearly the advantage increases with the number of bits or levels stored in the multi-level memory cell.

Figure 6:
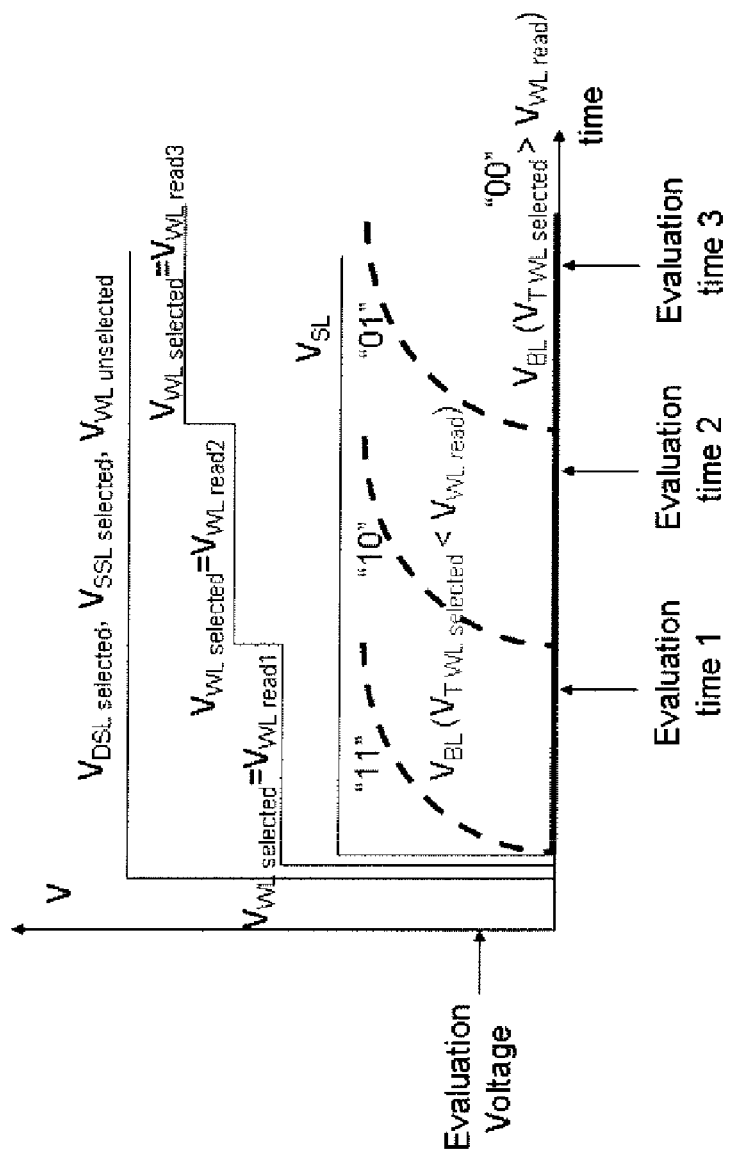
FIG. 6 illustrates the signal evolution with respect time during a reading operation of a memory cell according to the reading method in FIG. 5.

FIG. 6 illustrates an example of the time evolution of the signals according to an embodiment of the method of FIG. 5. As illustrated, there are three evaluation times (Evaluation time 1, Evaluation time 2, and Evaluation time 3) which correspond to three different steps. At each of the evaluation times a different level of the MLC is addressed and evaluated. During each step, the voltages (DSL, SSL, $WL_{unselected}$, and $WL_{selected}$) are kept substantially constant which leaves the bit line voltage ($V_{BL}$) free to change and be evaluated.

As illustrated by dashed lines, where $V_{BL}=(V_{TWLselected}<V_{WLread})$ the bit line charges. A logical value "11" is assigned to memory cells with a threshold voltage smaller than first reading voltage for example a negative threshold voltage (corresponding to $V_{WL\ read1}=0V$); a logical value "10" is assigned to memory cells with a threshold voltage smaller than second reading voltage (corresponding to $V_{WL\ read2}32\ 2.5V$), a logical value "01" is assigned to memory cells with a threshold voltage smaller than third and last reading voltage (corresponding to $V_{WL\ read3}=5V$). A logical value "00" is assigned to memory cells with a threshold voltage larger than third and last reading voltage (corresponding to $V_{WL\ read3}=5V$), whose bit line is not charged (solid line in FIG. 6).

If the sensing circuit is switchable between two bit lines (odd 221 and even 222) a double speed/half consumption performance may be obtainable. The improvement may be even more if a larger number of bit lines are coupled to a single sensing circuit through the bit line switching element in the page buffer (for example reading time and consumption is reduced by a factor four if the sensing latch is coupled to four bit lines). As such, in some embodiments, after the evaluation of bit line voltage (for example, 305 or 507) the complementary bit line, i.e., the other bit line associated with the same sensing latch in the page buffer, is selected. The odd/even bit line switch allows for the selective coupling of the odd 221 or the even 222 bit line to the sensing circuit 125 in page buffer 120. For example, if the odd bit line 221 was first sensed, the sensing circuit 125 is switched to couple to the even bit line 222.

The sensing circuit 125 in the page buffer 120 senses the complementary bit line (even bit line 222 in the example above). In the case of the MLC, after each complementary sensing, the determination of if it is the last MLC level is made at 509. This continues for all bit lines associated with the same latch, and the corresponding data is read without discharging or charging the nodes in the NAND array 110. More precisely, in the case when multiple bit lines are associated with the same sensing circuit or sensing latch(es), a loop continues until the last bit line in the plurality of multiple bit lines has been sensed.

Figure 7:
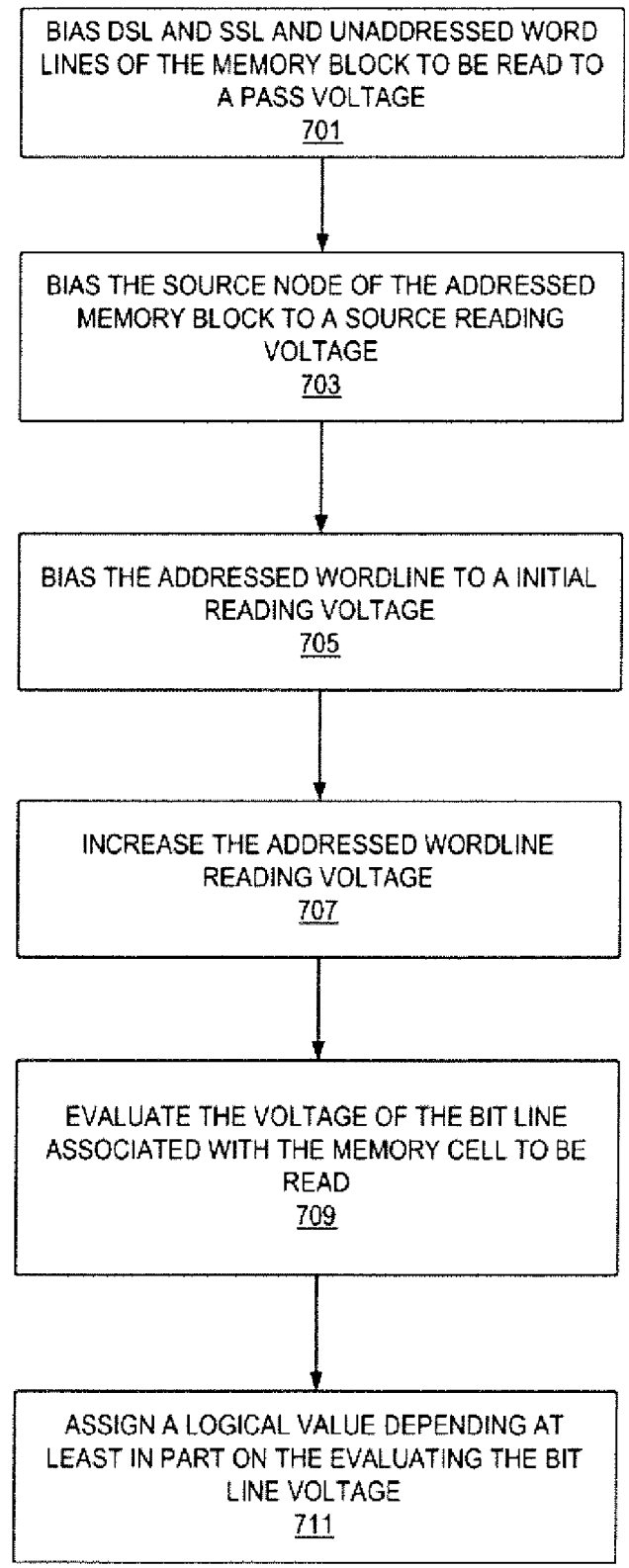
FIG. 7 depicts an embodiment of a method of reading memory cell values.

FIG. 7 depicts an embodiment of a method of reading memory cell values. Typically, reading a memory cell value is initiated via a read command which is received by the memory device. This command identifies which cell, or cells, are to be read from the memory block.

The DSL, SSL, and unaddressed word lines of the memory block to be read are biased to a pass voltage at 701. For example, the DSL 238 of FIG. 2 would be biased to the pass voltage value of $V_{DSL\ selected}$ and the SSL 234 would be biased to pass voltage value of $V_{SSL\ selected}$. Additionally, the unaddressed or unselected word lines (WL(i≠N)) of the addressed memory block are biased to pass voltage value of $V_{WL\ unselected}$. In one embodiment, the three pass voltages $V_{DSL\ selected}$, $V_{SSL\ selected}$ and $V_{WL\ unselected}$ are not the same voltage.

The source line of the memory block to be read is biased to a source reading voltage at 703. For example, a source reading voltage ($V_{SL\ read}$) is applied to the global 150 or local 160 source node to bias the source line 230 coupled to the addressed memory cell to be read. Of course, the order of biasing may be different than what is illustrated. For example, all of these lines may be biased at the same time, one at a time in any order, etc.

At 705, the selected (addressed) word line's voltage ($V_{WL\ selected}$) is biased to an initial value. At some point in time later, this is increased from the initial value to higher value at 707. For example, $V_{WL\ selected}$ is increased in a ramp-like fashion from the starting voltage $V_{WL\ selected}=0V$ to the end voltage $V_{WL\ selected}=6V$ with several points in between. In one embodiment, the $V_{WL\ selected}$ variation occurs according to a linear ramp, i.e., $V_{WL\ selected}(t)=k*t$, where t is time and k is a ramp rate, for example in the range 0.1-1.0V/μs.

At 709 the bit line voltage ($V_{BL}$) associated with the addressed memory cell is read. At any point in time "t", the selected word line is biased at a given reading voltage ($V_{WL\ selected}(t)$). Each of the addressed memory cells coupled to the selected word line may be either in a non-conductive state (if its threshold voltage is higher than the instantaneous reading voltage i.e., $V_{T\ WL\ selected}>V_{WL\ selected}(t)$) or in a conductive state (if its threshold voltage is lower than the instantaneous reading voltage i.e., $V_{T\ WL\ selected}<V_{WL\ selected}(t)$).

Figure 8:
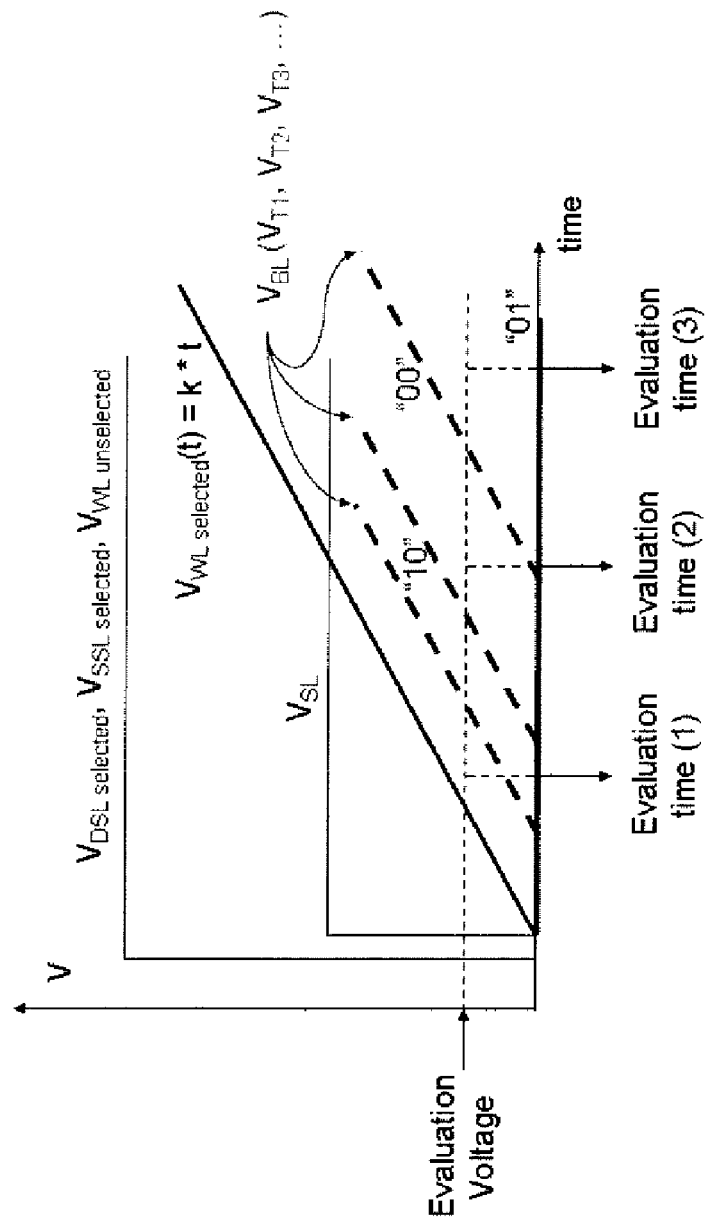
FIG. 8 illustrates the signal evolution with respect to time during a reading operation of a memory cell according to the reading method in FIG. 7.

With the increasing of the word line reading voltage, each addressed memory cell will eventually undergo a transition from a non-conductive (OFF) to a conductive (ON) state. The time of this transition depends on the value of the threshold voltage ($V_T$) of each memory cell. As soon as the word line reading voltage ($V_{WL\ selected}(t)$) exceeds the threshold voltage ($V_T$) of a given memory cell, the latter starts being conductive, an electrical path is established between the source line and the bit line, and the bit line coupled to the memory cell charges. The bit line voltage ($V_{BL}$) tends to reach the source line reading voltage ($V_{SL\ read}$) and follows the (increasing) selected word line reading voltage with a shift related to the threshold voltage of the memory cell. This is illustrated in FIG. 8 by the different (dashed) lines representing $V_{BL}(V_{T1})$, $V_{BL}(V_{T2})$, and $V_{BL}(V_{T3})$, $V_{T1}$, $V_{T2}$ and $V_{T3}$ being the threshold voltage of each one of three exemplifying memory cells, respectively. FIG. 8 illustrates the time evolution of the signals on some nodes according to embodiments of the method of FIG. 7.

In an embodiment, the source line reading voltage ($V_{SL\ read}$) is changed during the reading operation. For example, it is increased from a starting value to a final value according to a linear ramp with the same ramp rate as the word line reading voltage ramp.

At subsequent evaluation times (1, 2, and 3), the bit line voltage ($V_{BL}$) is sensed by the sensing circuit 125 in the page buffer 120 to determine the memory cell state and a logical value is assigned at 711 based at least in part on the evaluation of the bit line voltage. More precisely, a determination of when (in which time interval) each addressed memory cell turned to a conductive state is made. This information corresponds to the detection of the memory cell threshold voltage with a granularity corresponding to the instantaneous word line reading voltage at the moment of the bit line voltage sampling. In one embodiment, the evaluation time intervals have the same duration and the selected word line reading voltage increases according to a linear ramp. As such, the reading voltages are equally spaced apart (for example at 0V, 2V, and 4V) and the intermediate allowed threshold voltage intervals have the same width (2V in this case, neglecting possible margins with respect to the reading voltage). The logical values are assigned to the memory cell according to an encoding convention depending on when its state becomes conductive. A memory cell is "11" if before or at evaluation time (1), "10" if in the interval between evaluation time (1) and (2), "00" if in the interval between evaluation time (2) and (3), and "01" if the cell's state is not conductive at evaluation time (3). In another embodiment, different evaluation time intervals are used, so that un-equally spaced apart reading voltages are used and non-uniform allowed threshold voltage ranges are obtained. The lowest threshold voltage range is not limited by a lowest allowed threshold voltage value (i.e. negative threshold voltage values are in principle acceptable), while the highest threshold voltage range is anyhow limited by the pass voltage to be applied when the word line is unselected (otherwise the unselected memory cell would be in the OFF state and open the conductive path irrespective of the real datum to be sensed on the addressed memory cell).

In one embodiment, a latch in the sensing circuit 125 in the page buffer 120 is coupled to the bit line at the evaluation time(s) to sense the bit line voltage. If the bit line voltage exceeds the latch threshold, the latch switches and stores the information. In another embodiment, the bit line is constantly coupled to a latch in the sensing circuit 125 in the page buffer 120 and the dynamically up-dated information is read out from the latch at the pre-fixed evaluation times.

Depending on the operation, further enhancements may be possible such as double/multiple reading speed operation, which are described in detail below.

Figure 9:
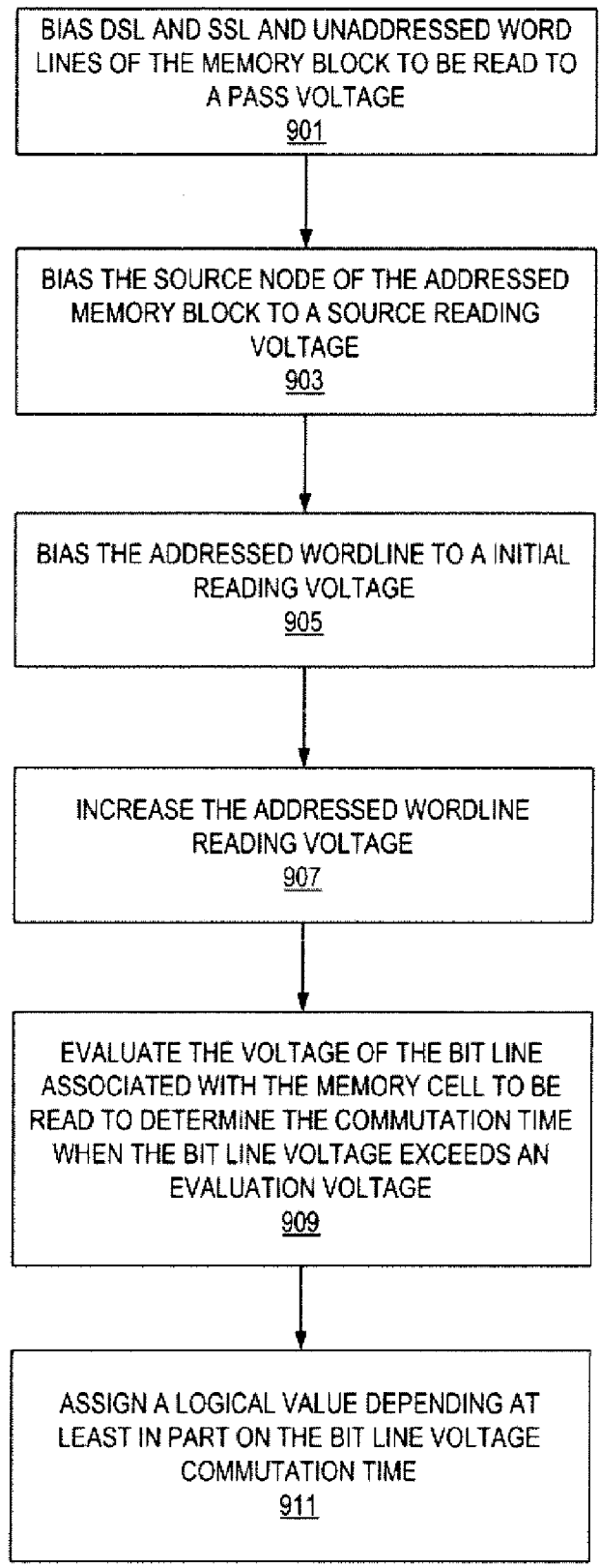
FIG. 9 depicts an embodiment of a method of reading memory cell values.

FIG. 9 depicts an embodiment of a method of reading memory cell values. Typically, reading a memory cell value is initiated via a read command which is received by the memory device. This command identifies which cell, or cells, are to be read from the memory block.

The DSL, SSL, and unaddressed word lines of the memory block to be read are biased to a pass voltage at 901. For example, the DSL 238 of FIG. 2 would be biased to the pass voltage value of $V_{DSL\ selected}$ and the SSL 234 would be biased to pass voltage value of $V_{SSL\ selected}$. Additionally, the unaddressed or unselected word lines (WL(i≠N)) of the addressed memory block are biased to pass voltage value of $V_{WL\ unselected}$.

The source line of the memory block to be read is biased to a source reading voltage at 903. For example, a source reading voltage ($V_{SL\ read}$) is applied to the global 150 or local 160 source node to bias the source line 230 coupled to the addressed memory cell to be read. Of course, the order of biasing may be different than what is illustrated. For example, all of these lines may be biased that the same time, one at a time in any order, etc.

At 905, the selected (addressed) word line's voltage ($V_{WL\ selected}$) is biased to an initial value.

At some point in time later, this is increased from the initial value to higher value at 907. For example, $V_{WL\ selected}$ is increased in a ramp-like fashion from the starting voltage $V_{WL\ selected}$=0V to the end voltage $V_{WL\ selected}$=6V with several points in between. In one embodiment, the $V_{WL\ selected}$ variation occurs according to a linear ramp, i.e., $V_{WL\ selected}(t)=k*t$, where "t" is time and "k" is a ramp rate, for example in the range 0.1-1.0V/μs.

At any point in time "t," the selected word line is biased at a given reading voltage ($V_{WL\ selected}(t)$). Each of the addressed memory cells coupled to the selected word line may be either in a non-conductive state (if its threshold voltage is higher than the instantaneous reading voltage i.e., $V_{T\ WL\ selected} > V_{WL\ selected}(t)$) or in a conductive state (if its threshold voltage is lower than the instantaneous reading voltage i.e., $V_{T\ WL\ selected} < V_{WL\ selected}(t)$).

Figure 10:
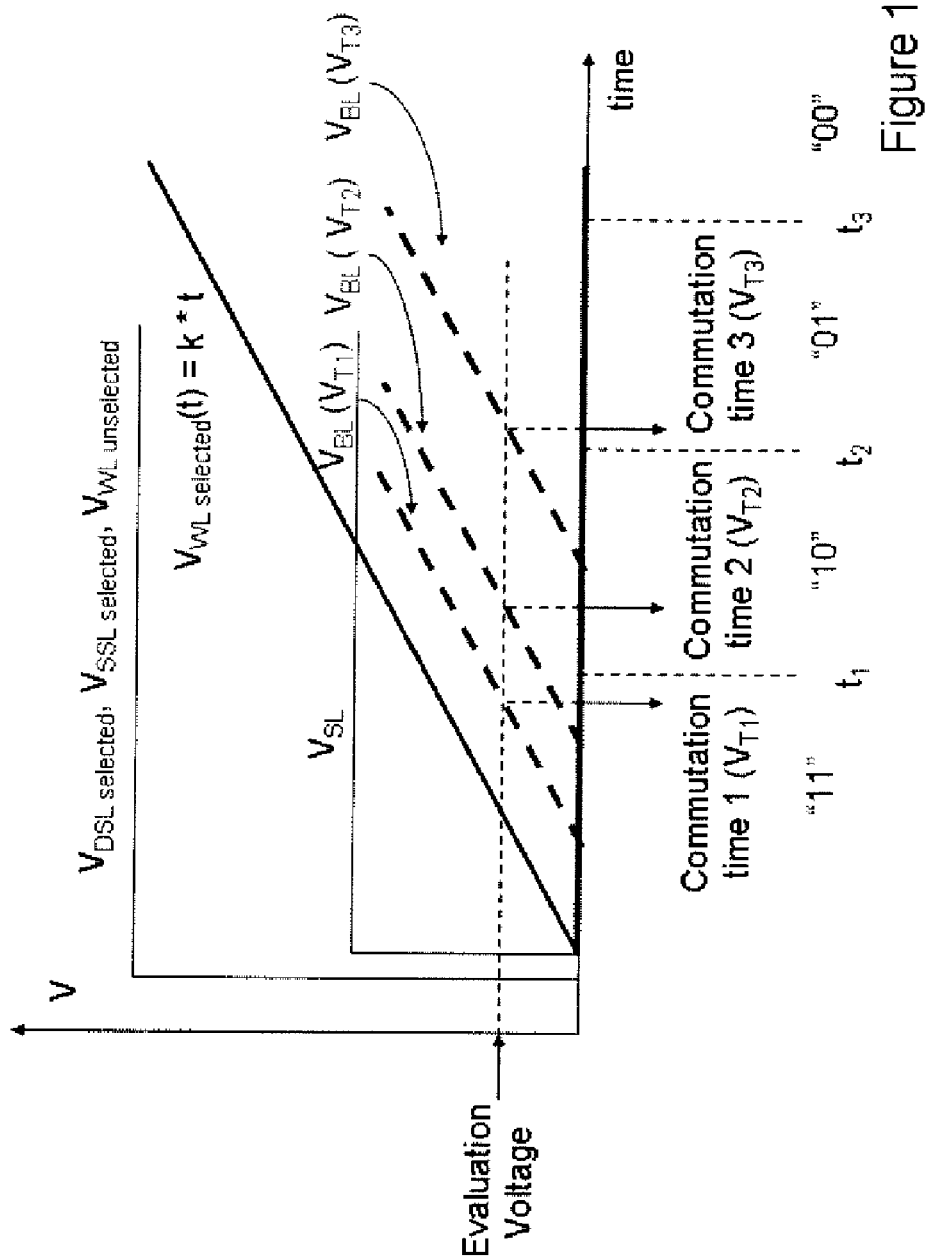
FIG. 10 illustrates the signal evolution with respect to time during a reading operation of a memory cell according the embodiment of the reading method in FIG. 9.

With the increasing of the word line reading voltage in time, each addressed memory cell will eventually undergo a transition from a non-conductive (OFF) to a conductive (ON) state. The time of this transition depends on the value of the threshold voltage ($V_T$) of each memory cell. As soon as the word line reading voltage ($V_{WL\ selected}(t)$) exceeds the threshold voltage ($V_T$) of a given memory cell, the latter starts being conductive, an electrical path is established between the source line and the bit line, and the bit line coupled to the memory cell charges. The bit line voltage ($V_{BL}$) tends to reach the source line reading voltage ($V_{SL\ read}$) and follows the (increasing) selected word line reading voltage with a shift related to the threshold voltage of the memory cell. This is illustrated in FIG. 10 by the different (dashed) lines representing $V_{BL}(V_{T1})$, $V_{BL}(V_{T2})$, and $V_{BL}(V_{T3})$, $V_{T1}$, $V_{T2}$ and $V_{T3}$ being the threshold voltage of each one of three exemplifying memory cells, respectively. FIG. 10 illustrates the time evolution of the signals on some nodes according to embodiments of the method of FIG. 9. In an embodiment, the source line reading voltage ($V_{SL\ read}$) is changed during the reading operation. For example, it is increased from a starting value to a final value according to a linear ramp with the same ramp rate as the word line reading voltage ramp.

At 909 the bit line voltage ($V_{BL}$) associated with the addressed memory cell is read to determine a commutation time when the bit line voltage exceeds an evaluation voltage. More precisely, the bit line voltage sensing mechanism includes measuring the commutation time of each memory cell. The commutation time that is indicative of a memory cell's threshold voltage, is measured and stored. Each bit line is coupled to a latch in the sensing circuit 125 in the page buffer 120 and when the bit line voltage exceeds the evaluation voltage, or the latch threshold voltage, the latch undergoes a commutation, or switches. In the example of FIG. 10 this occurs at commutation time 1 ($V_{T1}$), for a first memory cell with threshold voltage $V_{T1}$, and at commutation time 2 ($V_{T2}$) and commutation time 3 ($V_{T3}$), for a second and a third memory cells with threshold voltage $V_{T2}$ and $V_{T3}$, respectively.

At subsequent commutation times (1, 2, and 3), the bit line voltage ($V_{BL}$) is sensed by the sensing circuit 125 in the page buffer 120 to determine the memory cell state and a logical value is assigned at 911 based at least in part on the bit line voltage commutation time. More precisely, the reading time is divided in plurality of time intervals and a logical value is associated to each time interval. According to one embodiment, a determination of when (in which time interval) each addressed memory cell turned to a conductive state is made. This information corresponds to the detection of the memory cell threshold voltage corresponding to the instantaneous word line reading voltage at the moment of the bit line voltage sampling (within a voltage range proportional to the granularity in commutation time measurement and reading voltage ramp rate). In an embodiment, the logical value assigned to the addressed memory cell uses the following convention. For example, the reading time is subdivided in four time intervals by instances $t_1$, $t_2$ and $t_3$ in FIG. 10. The memory cells whose commutation time is before time $t_1$ are assigned the logical value "11," the memory cells whose commutation time is in the interval $t_1$ to $t_2$ are assigned the logical value "10," the memory cells whose commutation time is in the interval $t_2$ to $t_3$ are assigned the logical value "01," and the memory cells whose commutation time is after time $t_3$ (i.e., for which no commutation occurred at time $t_3$, yet) are assigned the logical value "00." The lowest threshold voltage range is not limited by a lowest allowed threshold voltage value (i.e. negative threshold voltage values are in principle acceptable), while the highest threshold voltage range is anyhow limited by the pass voltage to be applied when the word line is unselected (otherwise the unselected memory cell would be in the OFF state and open the conductive path irrespective of the real datum to be sensed on the addressed memory cell).

In one embodiment, the memory device 100 includes a clock with an associated counter (not shown in FIG. 1) coupled to the sensing circuit 125 in the page buffer 120. The switching of the sensing latch in the page buffer 120 when the bit line voltage exceeds the evaluation voltage triggers the latching of a counter value associated with the corresponding bit line, so that the commutation time of each memory cell is stored. When the word line reading voltage is a linear voltage ramp ($V_{WL\ selected}(t)=k*t$), the memory cell's threshold voltage is obtainable from the clock counter value because of the linear relationship between the two quantities (and the known starting voltage value and ramp rate). In practice the counter is also indicative of threshold voltage.

The granularity in the determination of the commutation time and/or the threshold voltage of the addressed memory cell is only limited by the number of bits stored by the counter (and the clock frequency). For example, if the addressed wordline is biased with a reading voltage featuring a linear ramp from 0V to 5V in 10 μs, or $V_{WLselected}(t)=500,000[V/s]*t[s]$, and a 10 bit counter is used, the time granularity is 10 μs/1024 or about 10 ns, corresponding to approximately a 50 mV granularity in threshold voltage determination. This is useful when a precise evaluation of the threshold voltage is necessary, such as in those devices using convolutional coding and/or soft-decision reading approaches, or even in analog reading applications.

In another embodiment the page buffer 120 includes a plurality of sensing latches (not shown in FIG. 1) in the sensing circuit 125 associated with each bit line. Only one latch in the plurality is active at a given time, responsive to mutually exclusive control signals. At the end of the sweep of word line reading voltage ($V_{WL\ selected}(t)$) a determination is made of which latch has switched at the commutation time. Therefore, the commutation time is determined with the time granularity being only limited by the number of sensing latches used to sample the bit line voltage during the entire sweep time, that is, how finely the time interval is split. For example, if the addressed wordline is biased with a reading voltage featuring a linear ramp from 0V to 6V in 12 μs, or $V_{WL\ selected}(t)=500,000[V/s]*t[s]$, and 8 latches are used, the time granularity is 12 μs/8=1.5 μs, corresponding to a 0.75V (i.e., 6V/8) granularity in threshold voltage determination.

Depending on the operation, further enhancements may be possible such as double/multiple reading speed operation, which are described in detail below.

The commutation time reading approaches described above are suitable for multi-level data storage and have several advantages and interesting performances, too. For example, the selected word line reading voltage is ramp-like increased while maintaining the remaining nodes at their respective biasing voltage which allows for a reduction of reading time and energy consumption because it is not necessary to continuously charge and discharge the different nodes, especially the bit lines, nor to wait for such a precharging operation to be performed before each sensing step.

The proposed approaches described above also allow for a further reduction in reading time and power consumption, for example they may be further reduced to almost half of the already improved values if two bit lines are associated with the same sensing circuit, and even more if more than two bit lines are associated with the same sensing circuit 125 in the page buffer 120.

The discussion below independently applies to either one of the embodiments already discussed. It has been explained that in each NAND block 130, for example the addressed block 210, a word line, for example the selected word line WL(N), is coupled to one memory cell in each NAND string 140, for example odd string 211 and even string 212. Also the global 150 or the local 160 source node (that is source line 230), as well as the source selection line (SSL selected 234) and the drain selection line (DSL selected 238) are shared among all NAND strings 140 (or 211 and 212) in the same NAND block 130 (or 210).

With this configuration, all strings in the addressed block 210 are biased with the same reading/pass voltages on all corresponding nodes: unaddressed word lines (WL(i≠N)) are biased to pass voltage ($V_{WL\ unselected}$) and DSL selected and SSL selected to respective pass voltages ($V_{DSL\ selected}$ and $V_{SSL\ selected}$) to set all unaddressed memory cells and pass transistors to a conductive state. Shared source node 230 is biased to source reading voltage ($V_{SL\ read}$) and the selected word line WL(N) is biased to the reading voltage ($V_{WL\ selected}$), either constant, stepwise increased, or ramp-like increased ($V_{WL\ selected}(t)$).

Consequently all memory cells in selected word line (WL(N)) are simultaneously biased under the same conditions and in practice all of them are addressed in parallel. Each bit line associated with each addressed memory cell possibly charges toward the source reading voltage depending on the relative value of corresponding addressed memory cell threshold voltage ($V_T$) with respect to selected word line voltage ($V_{WL\ selected}(t)$).

All bit lines in the addressed block 210 are in a charged or in an uncharged state reflecting the information stored in the associated addressed memory cell on addressed word line (WL(N)). The sensing circuit 125 (or sensing latch, depending on which sensing approach is considered) in the page buffer 120 is associated to a pair of bit lines, i.e., an odd bit line 221 and an even bit line 222 and may be coupled to either one of them through a odd/even bit line decoding switch element (not shown in FIG. 1).

At the evaluation time, the sensing circuit 125 is coupled to one of the bit lines associated to it, for example the odd bit line 221, and the corresponding information (indicative of the ON/OFF status of the addressed memory cell in the odd string 211) is sensed and read. The information is also transferred to a further buffer stage in the output path. At the same time the information indicative of the ON/OFF status of the other addressed memory cell in the other string, for example, even string 212, is available as a bit line voltage of the even bit line 222. The sensing circuit is then reset (i.e., the sensing latch is reset to its default value) and coupled to the even bit line 222 through the odd/even bit line decoding switch element. The even bit line voltage is then sensed and the corresponding information read.

The sensing method described above makes it possible to stimulate simultaneously, and in parallel, all memory cells coupled to the selected word line and generate a corresponding bit line voltage variation, reflecting the stored data, for all bit lines in parallel. The method serially senses the bit line voltage by quickly switching the sensing circuit among the bit lines and therefore avoids repetitions in the charging/discharging of nodes in the NAND array. The switching and sensing time are negligible with respect to charging and/or discharging time, so that no error is introduced even in case the word line voltage is not kept constant during the sensing (i.e., it is changed according to $V_{WL\ selected}(t)$ as described above with reference to FIGS. 7 to 10)—at most a minor but reproducible shift in the evaluation time or in the threshold voltage takes place for the sequentially accessed bit lines.

Whichever embodiment is considered among the ones described above, a dedicated bit line with a memory cell programmed at a known threshold voltage value may be used as a reference to check and correct the exact threshold voltage reading by compensating for possible variations (i.e., due to temperature, power supply, etc.). In one embodiment, more than a single cell are, for example three cells, programmed at three threshold voltage values approximately equally spaced apart, so that a finer monitoring of the correctness of the reading is obtained.

The description above has considered the detailed functionality of a floating gate flash memory with NAND architecture. In one embodiment, featuring a NOR architecture, the array organization is correspondingly modified (for example, there are no strings in the array and correspondingly there are no pass transistors or memory cells in series with the addressed one) and the operation is consistently adapted, however without modifying the working principle. Also, in this case, the bit lines are initially discharged, for example to the ground voltage and the unselected word lines (WL(i≠N)) are biased to an conduction inhibition voltage (for example, the ground voltage) to avoid possible conduction paths in parallel with the addressed one. The source node is biased to a source reading voltage ($V_{SL\ read}$) and the selected word line (WL(N)) is biased to the reading voltage ($V_{WL\ selected}$) (either constant, stepwise increased, or ramp-like increased ($V_{WL\ selected}(t)$)). The bit line voltage ($V_{BL}$) is then sensed in a similar way as described with reference to the NAND architecture.

Independent of the memory architecture, the memory cells need not be of the floating gate type and in one embodiment they are charge-trap memory cells.

FIG. 11 illustrates a system 1100 including a memory device 100 according to one of the embodiments described above. The system 1100 may be a computing system like a computer, a PDA, or the like; it may also be a mobile phone, a camcorder or a digital camera, and FIG. 11 includes in an exemplifying and non-limiting manner some features in the latter case. The system 1100 includes micro-controller 1110 coupled to the memory device 100. In one embodiment, the memory device 100 is of the removable type, such as a micro-SD card, a USB data storage unit, or the like. The memory device stores data and/or instructions for use by the micro-controller 1110.

In one embodiment, the micro-controller 1110 is also coupled to an optical system 1120 including one or more lenses 1124 for defining an image on an image sensor 1126. The image sensor 1126 may be CCD or CMOS. Other elements may be included in the optical system 1120, for example filters, mechanical elements to move the lens(es) in order to zoom in or out the image, etc. The micro-controller 1110 controls through control signals the operation of the optical system 1120 and receives from it digital data representing the captured image or images (in case of a sequence of frames). The micro-controller stores at least temporarily the data related to the images into the memory device 100.

The micro-controller 1110 is also coupled to Input/Output elements such as keys 1130 and/or display 1140. The keys are used to input instructions and parameters to the micro-controller 1110, for example to press the shutter, to control the zoom, the shutter delay, or to select an image size and/or special effects to be applied to the images. The micro-controller 1110, when so requested, retrieves the image from the memory device and displays it on the display 1140. In one embodiment, the display 1140 is a touch-screen display, so that the keys 1130 are functionally embedded in the display 1140, for example a region of the touch-screen is associated to a key and the system 1100 responds to the pressing within such a region according to the key meaning associated to the region at that time.

In the foregoing specification, the invention has been described with reference to specific exemplary embodiments thereof. It will, however, be evident that various modifications and changes may be made thereto without departing from the broader spirit and scope of the invention as set forth in the appended claims. For example, the detailed description has been given using a floating gate NAND Flash memory device, but with the appropriate modifications the invention also applies to memory devices with different architecture, i.e. NOR, and different technology, such as charge trap memories or phase change memories. Additionally, embodiments of the methods may be in different orders and/or have biasing, etc. occur at different times than what is described. As another example, the system 1100 need not be an optical system and may have other features such as electronic I/O ports. Additionally, the system 1100 may either be battery and/or AC powered. The specification and drawings are, accordingly, to be regarded in an illustrative rather than a restrictive sense.

The invention claimed is:

1. A method to read a first memory cell of a memory block of a memory device,
    wherein the first memory cell is coupled to a source line and to a first bit line,
    the method comprising:
    biasing a drain select line (DSL), a source select line (SSL), and unaddressed wordlines of the memory block to a pass voltage to set the DSL, SSL, and unaddressed wordlines into a conducting status;
    applying a source reading voltage to a source node of the source line;
    biasing a wordline coupled to the first memory cell to a reading voltage, wherein the wordline coupled to the first memory cell is biased to a ramp-wise wordline reading voltage from a starting wordline reading voltage; and
    evaluating the voltage of the first bit line to determine the logical value of the memory cell.

2. The method of claim 1, wherein said evaluating the first bit line voltage occurs during a charging phase of the first bit line.

3. The method of claim 1 further comprising:
    assigning a logical value depending at least in part on said evaluating the first bit line voltage.

4. The method of claim 1 further comprising:
    waiting an evaluation period before the evaluating the first bit line voltage.

5. The method of claim 1, wherein evaluating the voltage of the first bit line comprises:
    sensing the voltage of the first bit line at a plurality of evaluation times during said biasing the wordline coupled to the first memory cell to a ramp-wise wordline reading voltage.

6. The method of claim 1, wherein evaluating the voltage of the first bit line comprises:
    sensing a commutation time when the voltage of the first bit line exceeds a predetermined voltage.

7. The method of claim 6 further comprising:
    storing at least temporarily information representative of the commutation time.

8. The method of claim 6 wherein the commutation time is indicative of a threshold voltage of the first memory cell.

9. The method of claim 1 wherein the memory device further comprises a second memory cell coupled to a second bit line and to the source line, the bit lines selectively coupled to a sensing circuit, the method further comprising:
    coupling the first bit line to the sensing circuit to sense the voltage of the first bit line to determine a status of the first memory cell;
    decoupling the first bit line from the sensing circuit;
    coupling the second bit line to the sensing circuit; and
    sensing a voltage of the second bit line to determine a status of the second memory cell.

10. The method of claim 9 further comprising:
    biasing a wordline coupled to the first and to the second memory cells to a wordline reading voltage, wherein said sensing the voltage of the second bit line to determine a status of the second memory cell is completed while the wordline reading voltage is essentially unchanged with respect to the wordline reading voltage during said sensing the voltage of the first bit line to determine a status of the first memory cell.

11. A memory device comprising:
    a first memory cell coupled to a first bit line, a wordline, and a source line;
    a source voltage generator coupled to the source line to supply a source reading voltage to the source line to charge the first bit line responsive to a status of the first memory cell during a reading of the first memory cell; and
    a sensing circuit coupled to the first bit line to sense a bit line voltage to determine a status of the first memory cell.

12. The memory device of claim 11 wherein the memory device is a NAND device.

13. The memory device of claim 11 further comprising:
    a wordline voltage generator coupled to the wordline to supply a wordline reading voltage to the wordline during the reading of the first memory cell.

14. The memory device of claim 11 further comprising:
    a timer coupled to the sensing circuit to trigger a sensing of the voltage of the first bit line.

15. The memory device of claim 14 further comprising:
    a wordline voltage generator coupled to the word line to supply a plurality of wordline reading voltages to the wordline during the reading of the first memory cell, wherein the timer to generate a plurality of triggering events to trigger a plurality of sensing a bit line voltage, each triggering event in the plurality of triggering events corresponding to a word line voltage in the plurality of wordline voltages.

16. The memory device of claim 11 further comprising:
a second memory cell coupled to the source line;
a second bit line coupled to the second memory cell and to the sensing circuit; and
a switching element coupled to the first bit line, the second bit line, and the sensing circuit to selectively couple one of the first bit line and the second bit line to the sensing circuit while decoupling the other bit line for selectively reading the first memory cell or the second memory cell.

17. The memory device of claim 11 further comprising:
a plurality of latches for storing a configuration representing a commutation time indicative of a threshold voltage of the first memory cell.

18. Apparatus comprising:
a micro-controller; and
a memory coupled to the micro-controller to store data, wherein the memory comprises:
a memory cell to store a datum, wherein the memory cell is coupled between a source line and a bit line;
a source voltage generator to supply a source reading voltage to the source line to charge the bit line responsive to a status of the memory cell during a reading of the datum in the memory cell; and
a sensing circuit coupled to the bit line to sense a bit line voltage during the reading of the datum in the memory cell to determine a status of the memory cell.

* * * * *

UNITED STATES PATENT AND TRADEMARK OFFICE
CERTIFICATE OF CORRECTION

PATENT NO. : 8,248,851 B1  
APPLICATION NO. : 12/628073  
DATED : August 21, 2012  
INVENTOR(S) : Federico Pio et al.

Page 1 of 1

It is certified that error appears in the above-identified patent and that said Letters Patent is hereby corrected as shown below:

In column 16, line 5, in Claim 4, after "before" delete "the".

Signed and Sealed this  
Sixteenth Day of October, 2012

David J. Kappos  
*Director of the United States Patent and Trademark Office*